(12) United States Patent
Schwamb

(10) Patent No.: US 11,183,666 B2
(45) Date of Patent: Nov. 23, 2021

(54) OPTOELECTRONIC SEMICONDUCTOR COMPONENT

(71) Applicant: PICTIVA DISPLAYS INTERNATIONAL LIMITED, Dublin (IE)

(72) Inventor: Philipp Schwamb, Regensburg (DE)

(73) Assignee: PICTIVA DISPLAYS INTERNATIONAL LIMITED, Dublin (IE)

( * ) Notice: Subject to any disclaimer, the term of this patent is extended or adjusted under 35 U.S.C. 154(b) by 0 days.

(21) Appl. No.: 16/806,272

(22) Filed: Mar. 2, 2020

(65) Prior Publication Data

US 2020/0203659 A1 Jun. 25, 2020

Related U.S. Application Data

(63) Continuation of application No. 15/569,377, filed on Oct. 25, 2017, now Pat. No. 10,593,907.

(30) Foreign Application Priority Data

Apr. 29, 2015 (DE) .......................... 102015106631.9

(51) Int. Cl.
*H01L 51/52* (2006.01)
*H01L 51/00* (2006.01)
*H01L 51/44* (2006.01)

(52) U.S. Cl.
CPC ...... *H01L 51/5253* (2013.01); *H01L 51/0096* (2013.01); *H01L 51/448* (2013.01); *H01L 51/0097* (2013.01); *Y02E 10/549* (2013.01)

(58) Field of Classification Search
CPC ............. H01L 51/5253; H01L 51/0096; H01L 51/0097; H01L 51/448; Y02E 10/549
See application file for complete search history.

(56) References Cited

U.S. PATENT DOCUMENTS 6,720,572 B1 * 4/2004 Jackson .............. H01L 51/0545
257/103
8,536,611 B2 9/2013 Aratani et al.
(Continued)

FOREIGN PATENT DOCUMENTS

DE 19935823 B4 7/2006
DE 102008033017 A1 1/2010
(Continued)

OTHER PUBLICATIONS

Requirement for Restriction/Election received in U.S. Appl. No. 15/569,377, dated Sep. 14, 2018.
(Continued)

*Primary Examiner* — Peniel M Gumedzoe
(74) *Attorney, Agent, or Firm* — Botos Churchill IP Law LLP

(57) ABSTRACT

The invention relates to an optoelectronic semiconductor component (10) comprising a substrate (1), a first insulator layer (2), and a second insulator layer (3). Furthermore, the semiconductor component (10) comprises an organic semiconductor layer sequence (4) having an active area (4a) which, during operation, generates or receives light, a first electrode (5) and a second electrode (6), and encapsulation (7) which covers the organic semiconductor layer sequence (4) and the first insulator layer (2) completely and covers the second insulator layer (3) and the first electrode (5) or the second electrode (6) partially. Here, the first electrode (5) is arranged between the organic semiconductor layer sequence (4) and the first insulator layer (2), and the second electrode (6) is arranged on the organic semiconductor layer sequence (4), wherein the first electrode (5) and/or the second electrode (6) is/are at least partly arranged on the second insulator layer (3).

17 Claims, 2 Drawing Sheets

(56) References Cited

U.S. PATENT DOCUMENTS

| | | | |
|---|---|---|---|
| 2005/0156519 A1 | 7/2005 | Yoshizawa et al. | |
| 2005/0270259 A1* | 12/2005 | Shirasaki | H01L 27/3279 345/76 |
| 2011/0006972 A1* | 1/2011 | Tanaka | H01L 27/3276 345/76 |
| 2011/0266590 A1 | 11/2011 | Heuser | |
| 2014/0306209 A1 | 10/2014 | Osaki et al. | |

FOREIGN PATENT DOCUMENTS

| | | |
|---|---|---|
| DE | 102012214248 A1 | 2/2014 |
| DE | 102014106885 A1 | 11/2015 |
| EP | 1492387 A1 | 12/2004 |
| EP | 2629590 A1 | 8/2013 |
| EP | 2770802 A1 | 8/2014 |

OTHER PUBLICATIONS

Non-Final Rejection received in U.S. Appl. No. 15/569,377, dated Feb. 20, 2019.
Ex Parte Quayle Action received in U.S. Appl. No. 15/569,377, dated Aug. 16, 2019.
Notice of Allowance received in U.S. Appl. No. 15/569,377 dated Oct. 31, 2019.

* cited by examiner

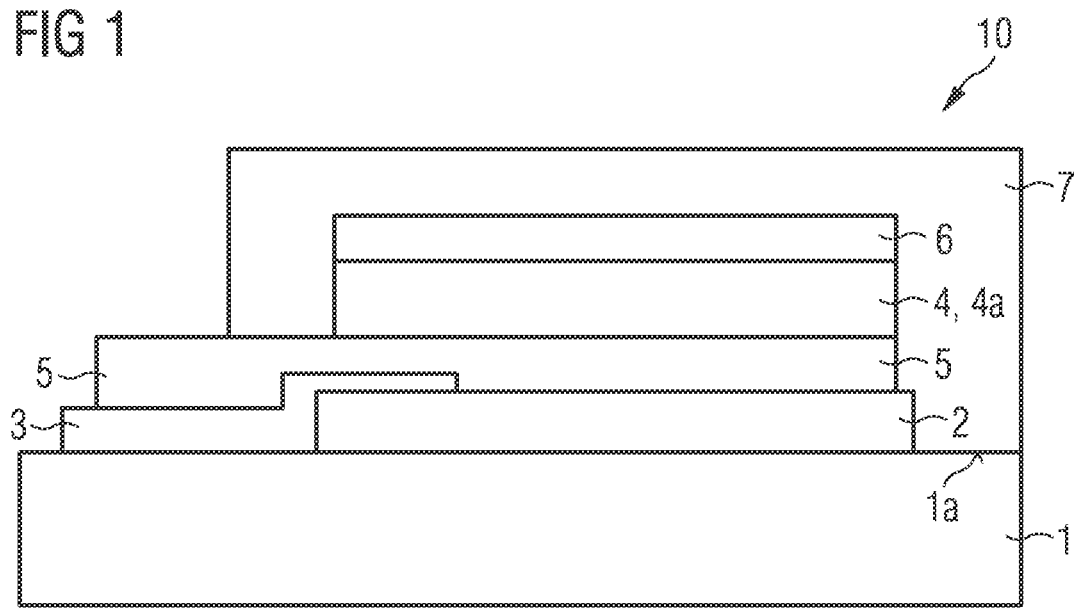
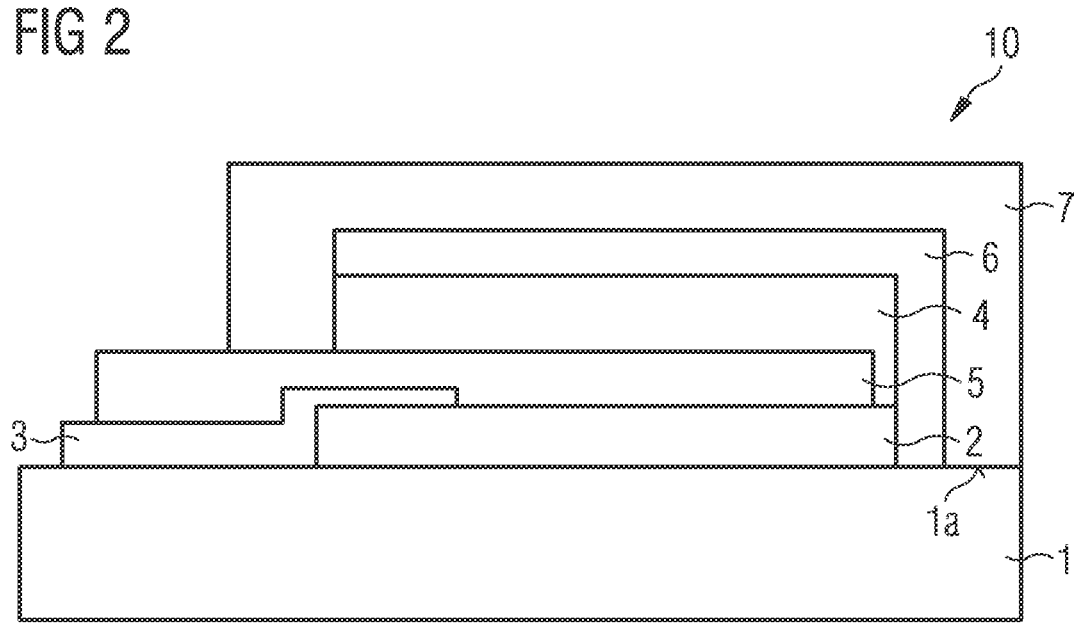

OPTOELECTRONIC SEMICONDUCTOR COMPONENT

CROSS-REFERENCE OF RELATED APPLICATION

This patent application is a continuation of U.S. National Phase application Ser. No. 15/569,377, filed on Oct. 25, 2017, under 35 U.S.C. § 371 of International Patent Application No. PCT/EP2016/059528, filed on Apr. 28, 2016, which in turn claims the priority of the German patent application 10 2015 106 631.9, filed on Apr. 29, 2015, the disclosure content of which is hereby incorporated by reference.

DESCRIPTION

The invention relates to an optoelectronic semiconductor component.

The invention is based on the object of providing an optoelectronic semiconductor component having improved protection of the organic layers against external influences.

This object is achieved by an optoelectronic semiconductor component according to the independent claim. Advantageous embodiments and developments of the invention are provided by the dependent claims.

The optoelectronic semiconductor component comprises a substrate, a first insulator layer and a second insulator layer as well as an organic semiconductor layer sequence having an active region, which generates or receives light during operation. Furthermore, the optoelectronic semiconductor component comprises a first electrode and a second electrode and an encapsulation, which completely covers the organic semiconductor layer sequence and the first insulator layer and partly covers the second insulator layer and the first electrode or the second electrode.

To facilitate the application of the organic semiconductor layer sequence on to the substrate and to insulate the organic semiconductor layer sequence from the substrate, it is advantageous to arrange a first insulator layer on a surface of the substrate on which the organic semiconductor layer sequence is to be arranged. An encapsulation acts as protection for the organic semiconductor layer sequence as well as the first insulator layer. The second insulator layer and the substrate as well as the electrodes and any further constituents of the component can advantageously also be surrounded by the encapsulation and protected against external influences. The insulator layers are advantageously arranged in the semiconductor component as further constituents; in other words the insulator layers are not a section of an existing constituent formed e.g. by natural oxidation, such as a substrate which forms an oxide layer over time. The encapsulation can comprise a cured potting, e.g. an epoxy resin. In this case, at least part of the first electrode or the second electrode is free from the encapsulation, e.g. the first electrode is partly exposed by an opening in the encapsulation. As a result, the component can advantageously be electrically contacted externally at this exposed site.

In the optoelectronic semiconductor component, the first electrode is arranged between the organic semiconductor layer sequence and the first insulator layer and the second electrode is arranged on the organic semiconductor layer sequence, wherein the first electrode and/or the second electrode is at least partly arranged on the second insulator layer.

The second electrode is arranged on a top side of the organic semiconductor layer sequence which faces away from the first and second insulator layers. For example, the second electrode is in the form of a cathode for the organic semiconductor layer sequence. The second electrode is advantageously transparent for electromagnetic radiation generated in the organic semiconductor layer sequence. The second electrode at least partly covers the organic semiconductor layer sequence on a top side which faces away from the first and second insulator layers.

Advantageously, an external contacting of the first electrode or second electrode takes place at a site at which the first electrode or the second electrode is arranged on the second insulator layer. For the electrical contacting of the organic semiconductor layer sequence here, the first electrode is arranged in the component in such a way that it contacts the organic semiconductor layer sequence from a bottom side. For this purpose, the first electrode is arranged between the organic semiconductor layer sequence and the first insulator layer. The first and second insulator layers advantageously insulate the first electrode and the organic semiconductor layer sequence from the substrate. For the purpose of electrical contacting, it is necessary to contact the first or second electrode from the outside, in which case the first or second electrode and the second insulator layer, on which the first or second electrode is arranged, may be subject to external influences such as moisture at the contacting site. In the case of external contacting via the first electrode, this extends over the first insulator layer to the second insulator layer. In the case of external contacting via the second electrode, this extends over a top side of the semiconductor layer sequence to the second insulator layer. In this way, an external electrical contacting of the organic semiconductor layer sequence is routed over the second insulator layer by means of either the first or the second electrode. Thus, it is advantageously achieved that external influences, such as e.g. moisture, cannot penetrate into the component, in particular into the first insulator layer and the organic semiconductor layer sequence, and impair the functioning of the component, or can do so to a significantly reduced extent. Advantageously, the first and second insulator layers can be of a particularly thin design with e.g. a typical thickness in the range from 10 nm to 10 µm. The typical thickness of the first insulator layer can preferably be in the range from 10 nm to 100 nm, inclusive in each case, and the typical thickness of the second insulator layer can preferably be in the range from 1 µm to 3 µm, inclusive in each case.

In at least one embodiment of the optoelectronic semiconductor component, the first insulator layer planarizes a top side of the substrate in one region, at least in some areas.

To improve the application of the organic semiconductor layer sequence on the substrate, it is advantageous to planarize a surface of the substrate on which the organic semiconductor layer sequence is to be arranged. By means of the first insulator layer, a planarizing of the surface of the substrate can advantageously be achieved.

In at least one embodiment of the optoelectronic semiconductor component, the first insulator layer comprises an organic polymer.

For example, the first insulator layer comprises a bisphenol-based polymer. Organic polymers are particularly suitable for planarizing a region on a substrate and thus for avoiding passing on a roughness of the substrate surface to other layers, such as the organic semiconductor layer sequence. For example, by means of the first insulator layer the roughness is reduced by a factor of two compared with the roughness of the substrate. For protection against external influences, such as moisture, the first insulator layer is advantageously surrounded completely on all sides by further components or by the encapsulation.

In at least one embodiment of the optoelectronic semiconductor component, the first insulator layer and the second insulator layer comprise different materials.

Advantageously, the first insulator layer can comprise an epoxide, acrylic or silicone. So that an impairment of the second insulator layer cannot be passed on to the first insulator layer, the first and second insulator layers advantageously comprise different materials. In this case, the second insulator layer is advantageously less sensitive to external influences, such as moisture. Since the organic semiconductor layer sequence is arranged only on the first insulator layer, the degree of a planarizing of the substrate is of particular importance only for the first insulator layer. For the second insulator layer, therefore, a material selection based on robustness towards external influences, such as moisture, can take priority. Furthermore, in the region of the external contacting, the adhesion of the first or second electrode to the second insulator layer can advantageously be increased.

In at least one embodiment of the optoelectronic semiconductor component, the second insulator layer comprises or consists of an inorganic material.

Inorganic materials are advantageously suitable for a particularly thin design of an insulation of a substrate. For example, the thickness of an insulation of this type is less than 100 nm, preferably less than 50 nm and particularly preferably less than 20 nm.

In at least one embodiment of the optoelectronic semiconductor component, the first insulator layer comprises an organic polymer and the second insulator layer comprises or consists of an inorganic material.

The second insulator layer is advantageously less sensitive to external influences compared with the first insulator layer, and can be used e.g. for an external contacting, advantageously at regions of openings of an encapsulation, wherein impairments of the second insulator layer, e.g. by external influences, are not significantly passed on to the first insulator layer. For this purpose, the first and second insulator layers advantageously comprise different materials. In this case, at the same time a high degree of planarizing of the substrate by the first insulator layer and a laterally routed electrical contacting of the first insulator layer by means of the second insulator layer, e.g. from an external region, can be achieved, wherein for the most part in the electrical contacting an impairment of the organic constituents of the semiconductor component by external influences can be avoided. In particular, a lateral moisture path from an external region to the first insulator layer can for the most part be avoided.

In at least one embodiment of the optoelectronic semiconductor component, the second insulator layer comprises or consists of an oxide or a nitride.

Silicon oxide, titanium oxide or $Al_2O_3$ is particularly suitable as an oxide. Silicon nitride is particularly suitable as a nitride.

In at least one embodiment of the optoelectronic semiconductor component, the substrate is electrically conductive or is provided with an electrically conductive layer.

The substrate can advantageously be electrically conductive in form, as a result of which the substrate itself advantageously acts as an external contact of the component. In this case, the contacting of the organic semiconductor layer sequence can take place from one side via the substrate.

The substrate itself can be electrically conductive and can comprise e.g. metal. Alternatively, the substrate can comprise an electrically conductive layer and can itself be insulating. The electrically conductive layer in this case can advantageously be arranged on a side of the substrate which faces towards the first and second insulator layers.

In at least one embodiment of the optoelectronic semiconductor component, the substrate comprises glass and a layer of ITO or metal, which is arranged on the glass.

In at least one embodiment of the optoelectronic semiconductor component, the substrate is in the form of a flexible metal film.

A flexible, in other words formable, metal film makes possible a component that can be adapted to a desired area in its shape and design.

In at least one embodiment of the optoelectronic semiconductor component, the first electrode or the second electrode is electrically connected to the substrate.

Advantageously, one of the two electrodes can be electrically connected to the substrate, wherein the substrate itself is electrically conductive or comprises an electrically conductive layer, wherein the electrode that is connected to the substrate is not externally contacted via the second insulator layer. In this case, the substrate also acts as an external electrode for the electrode connected to the substrate. Advantageously, the electrode connected to the substrate is completely covered by the encapsulation and can be externally contacted via the substrate without the need for an opening in the encapsulation for bonding the electrode connected to the substrate. For example, the second electrode can be connected to the substrate, wherein the second electrode advantageously extends laterally beside the organic semiconductor layer sequence up to the substrate. Alternatively, the first electrode can also be connected to the substrate, e.g. with a through-connection in one of the insulator layers.

In at least one embodiment of the optoelectronic semiconductor component, a metallization is arranged on the first electrode or on the second electrode for the purpose of external contacting.

The metallization is advantageously arranged on a region of the first electrode or second electrode located on the second insulator layer. Depending on which electrode is routed to the outside via the second insulator layer, this is the one to which this applies. Furthermore, the metallization is advantageously arranged in a region of the first electrode or second electrode in which this is electrically contacted externally. The metallization particularly comprises CrAlCr.

Furthermore, the metallization is free from the encapsulation, at least in some areas, for the purpose of external contacting.

In at least one embodiment of the optoelectronic semiconductor component, the second insulator layer is arranged on a top side of the substrate and the first insulator layer is arranged on the second insulator layer, wherein the first electrode or second electrode is electrically connected to the substrate by means of a through-connection through the second insulator layer.

In a top view of the substrate, the second insulator layer advantageously covers this over a greater area than the first insulator layer; in other words the covered area of the second insulator layer is advantageously greater than the covered area of the first insulator layer. The first electrode or the second electrode in this case extends to the second insulator layer. Through a through-connection in the second insulator layer, an electrical contact can be routed through this from the first or second electrode to the substrate. The through-connection can advantageously be formed as an opening in the second insulator layer. Furthermore, it is also possible to form multiple through-connections in the second insulator layer, advantageously for the same electrode in each case. The through-connection is advantageously introduced into the second insulator layer at a distance laterally from the first insulator layer.

In at least one embodiment of the optoelectronic semiconductor component, the second insulator layer is arranged on a top side of the substrate over the entire area.

The term "over the entire area" here is to be understood as meaning that the second insulator layer completely covers a top side of the substrate. In this case, it is advantageously the top side of the substrate that faces towards the organic semiconductor layer sequence.

In at least one embodiment of the optoelectronic semiconductor component, the second insulator layer is formed as an anodized layer.

The second insulator layer can advantageously be produced as an anodized layer. In this case, e.g. anodized aluminum is suitable as the anodized layer. By applying the second insulator layer as an anodized layer over the entire surface, the second insulator layer can advantageously be formed on the substrate simply and with few process steps, advantageously a single process step. Advantageously, it is possible to use a colored anodized aluminum layer.

In at least one embodiment of the optoelectronic semiconductor component, the encapsulation comprises a thin-film encapsulation and a protective lacquer, the protective lacquer outwardly sealing the semiconductor component.

The encapsulation can advantageously comprise a protective lacquer and a thin-film encapsulation, the thin-film encapsulation facing towards the constituents of the component and surrounding them directly. In this case, furthermore, the first electrode or the second electrode and the second insulator layer are free from the thin-film encapsulation as well as from the protective lacquer at the site to be externally contacted. The protective lacquer furthermore covers the thin-film encapsulation on its side facing away from the constituents of the component and outwardly seals the component. The thickness of the encapsulation is e.g. 0.1 µm to 1000 µm, advantageously 10 µm to 200 µm.

BRIEF DESCRIPTION OF THE DRAWINGS

Further advantages, advantageous embodiments and developments can be taken from the exemplary embodiments described below in conjunction with the figures.

FIGS. 1, 2 and 3 each show an optoelectronic semiconductor component in a sectional diagram.

Identical elements or elements having the same effect are in each case provided with the same reference numbers in the figures. The components illustrated in the figures and the size ratios to one another of the components should not be considered as being to scale.

FIG. 1 shows a sectional diagram of an optoelectronic semiconductor component 10.

Figure 3:
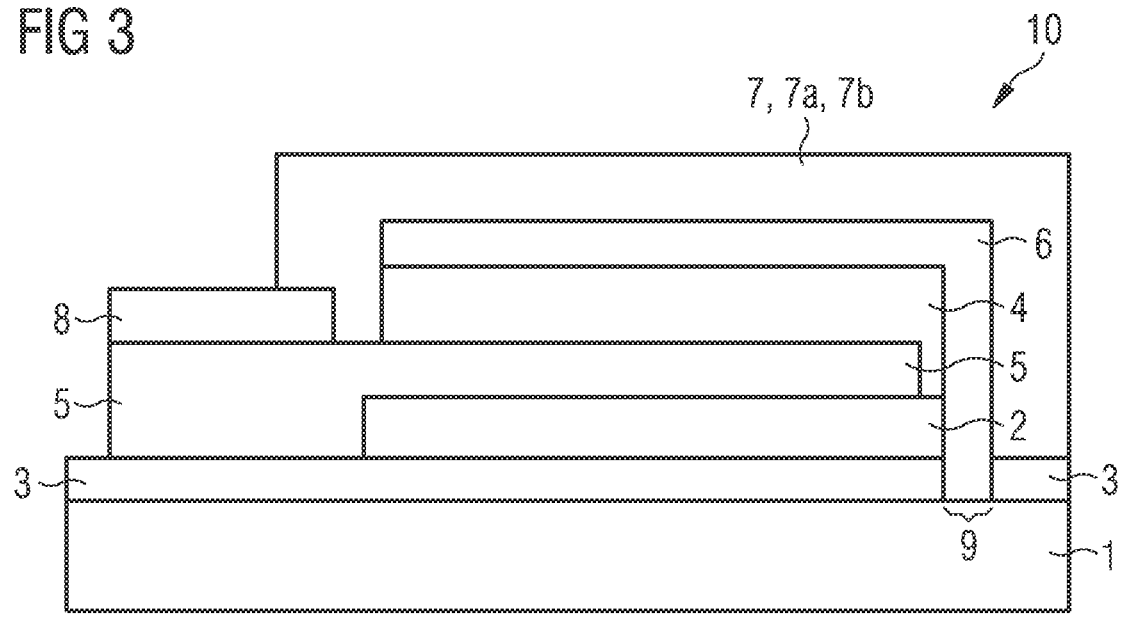

On a substrate 1, on a top side 1a, a first insulator layer 2 and a second insulator layer 3 are arranged. The first insulator layer 2 and the second insulator layer 3 here are arranged laterally one beside the other, so that they are in direct contact with one another. Furthermore, it is also possible here that the second insulator layer 3 partly extends to the first insulator layer 2 and partly covers it.

The first insulator layer 2 here planarizes the top side 1a of the substrate 1 in some areas, so that advantageously an application of further constituents of the semiconductor component is facilitated.

The semiconductor component 10 furthermore comprises a first electrode 5, which is arranged on the first insulator layer 2 and on the second insulator layer 3. The first electrode 5 here partly covers each of the first insulator layer 2 and the second insulator layer 3; however, it is also conceivable that the first electrode 5 completely covers at least one of the insulator layers.

The semiconductor component 10 furthermore comprises an organic semiconductor layer sequence 4 with an active region 4a, which generates or receives light during operation. The organic semiconductor layer sequence 4 is advantageously arranged exclusively over the first insulator layer 2, as a result of which the planarizing effect on the substrate 1 by the first insulator layer 2 is advantageously passed on to the organic semiconductor layer sequence 4 and an application thereof is improved. To this end, the first insulator layer 2 advantageously comprises an organic polymer.

By means of the organic polymer material, it is advantageously possible that the first insulator layer 2 is formed particularly thinly. The typical thickness of the first insulator layer can preferably be in the range from 10 nm to 100 nm, inclusive in each case. Thus, adequate planarizing as well as adequate electrical insulation from the substrate 1 are advantageously provided.

Furthermore, the optoelectronic semiconductor component 10 comprises at least one second electrode 6 and an encapsulation 7. The second electrode 6 is arranged on the organic semiconductor layer sequence 4 and covers this e.g. completely.

The encapsulation 7 completely covers or embeds the regions of the component 10 with the organic semiconductor layer sequence 4, the second electrode 6 and the first insulator layer 2, and partly covers the second insulator layer 3 and the first electrode 5 on the regions of the second insulator layer 3. In other words, the component 10 comprises a region of the substrate 1, of the first electrode 5 and of the second insulator layer 3 on a top side 1a of the substrate which are exposed, and this region of the first electrode 5 can be electrically contacted externally.

In order to be protected against external influences, such as moisture, therefore, the first insulator layer 2 and the organic semiconductor layer sequence 4 are completely built into the component 10; this can be achieved by their being enclosed by the encapsulation. The encapsulation 7 can comprise a cured potting, e.g. an epoxy resin.

The first and second insulator layers 2, 3 insulate the first electrode 5 and the organic semiconductor layer sequence 4 from the substrate 1. In this way, an electrical contacting of the organic semiconductor layer sequence 4 is routed from the second insulator layer 3 by means of the electrode 5 through the first insulator layer 2. Thus, it is advantageously achieved that external influences, such as e.g. moisture, cannot penetrate into the component, in particular into the first insulator layer 2 and the organic semiconductor layer sequence 4, and impair the functioning of the component, or can do so to a significantly reduced extent. To this end, the first and second insulator layers 2 and 3 comprise different materials, so that an impairment of the second insulator layer 3, e.g. by moisture, cannot be passed on to the first insulator layer 2. In this case, the second insulator layer 3 is advantageously less sensitive to external influences, such as moisture. The second insulator layer 3 advantageously comprises an inorganic material, e.g. an oxide or a nitride.

The substrate 1 can comprise a metal or can be transparent in form, e.g. comprising glass, with a conductive and transparent layer. Thus, an emission of light is possible either through a transparent second electrode 6 and a transparent encapsulation 7 or through a transparent first insulator layer 2, a transparent first electrode 5 and a transparent substrate 1. An emission in both directions at the same time is also conceivable.

FIG. 2 shows a sectional diagram of an optoelectronic semiconductor component 10 similar to that of FIG. 1. In contrast to the embodiment from FIG. 1, the second electrode 6 is routed laterally beside the organic semiconductor layer sequence 4 to the substrate 1 and electrically contacted therewith. In this case, the second electrode 6 is insulated from the first electrode 5 and the substrate 1 is electrically conductive. The encapsulation 7 advantageously also encapsulates the connection of the second electrode 6 to the substrate 1.

FIG. 3 shows a sectional diagram of an optoelectronic semiconductor component 10 similar to that of FIG. 2. In contrast to the embodiment from FIG. 2, the second insulator layer 3 is arranged on the substrate 1 and the first insulator layer 2 is arranged exclusively on the second insulator layer 3 and is not in direct contact with the substrate 1. The first electrode 5 here advantageously extends over the first insulator layer 2 on to the second insulator layer 3. The second electrode 6 is routed to the substrate 1 through a through-connection 9, which extends through the second insulator layer 3.

Furthermore, a metallization 8 is arranged on the first electrode 5. The metallization 8 comprises e.g. CrAlCr and, for the external contacting of the first electrode 5, extends over a region thereof which is not embedded by the encapsulation 7.

The encapsulation 7 comprises e.g. a thin-film encapsulation 7a and a protective lacquer 7b (not shown in detail), wherein the protective lacquer 7b outwardly seals the semiconductor component 10 and wherein the thin-film encapsulation 7a faces towards the constituents of the component 10 and directly surrounds them. The protective lacquer 7b furthermore covers the thin-film encapsulation on its side facing away from the constituents of the component 10.

Figure 4:
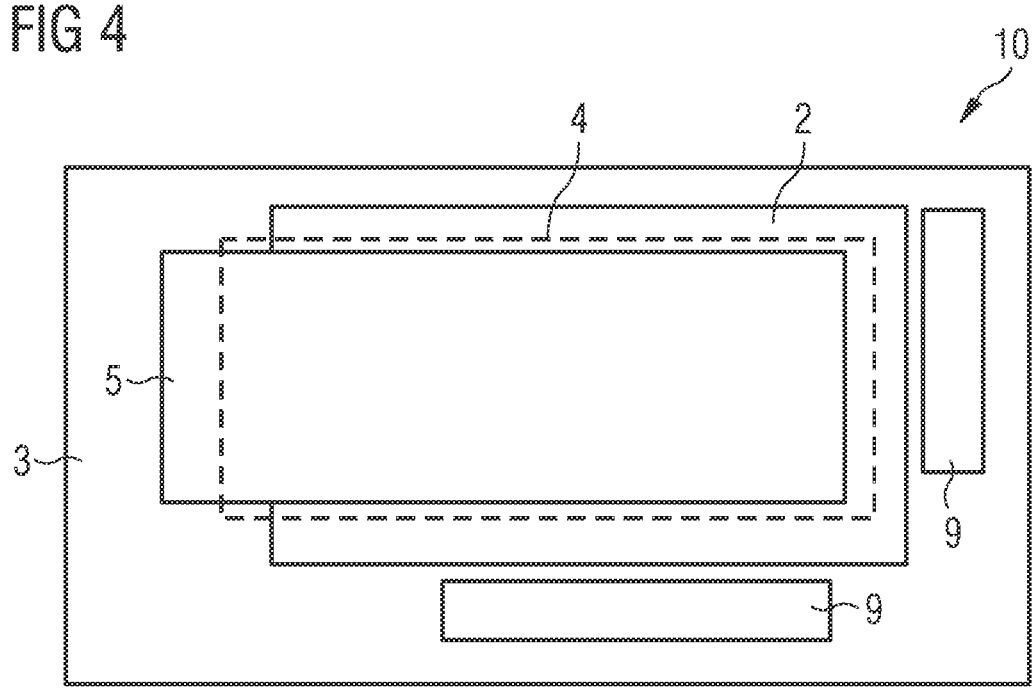
FIG. 4 shows an optoelectronic semiconductor component in a top-view diagram.

FIG. 4 shows an optoelectronic semiconductor component 10, similar to that of FIG. 3, in a top-view diagram.

The second insulator layer 3 is arranged on a top side of the substrate 1 over the entire area. The term "over the entire area" here is to be understood as meaning that the second insulator layer 3 completely covers a top side of the substrate 1. Furthermore, the second insulator layer 3 is in the form of an anodized layer.

By applying the second insulator layer 3 as an anodized layer over the entire surface, the second insulator layer 3 can advantageously be arranged on the substrate 1 simply and with few process steps, advantageously a single process step.

The second electrode (not shown) is connected to the substrate 1 through through-connections 9. In this case, it is possible that more than one, e.g. two, through-connections 9 are present which are arranged at a distance, laterally, from the first insulator layer 2.

In top view, it is shown that the organic semiconductor layer sequence 4 can be arranged in a region of the first insulator layer 2, and partly also of the second insulator layer 3, which extends beyond the first electrode 5 in some areas. As a result of the contacting with the first electrode 5, however, only one luminous region is obtained which, with the region of the first electrode 5 below the organic semiconductor layer sequence 4, coincides therewith.

The description with the aid of the exemplary embodiments does not limit the invention thereto. Rather, the invention comprises any new feature and any combination of features, which in particular includes any combination of features in the patent claims, even if this feature or this combination is not per se explicitly stated in the patent claims or exemplary embodiments.

LIST OF REFERENCE NUMBERS

1 Substrate
1a Top side
2 First insulator layer
3 Second insulator layer
4 Organic semiconductor layer sequence
4a Active region
5 First electrode
6 Second electrode
7 Encapsulation
7a Thin-film encapsulation
7b Protective lacquer
8 Metallization
9 Through-connection
10 Optoelectronic semiconductor component

What is claimed is:
1. An optoelectronic device comprising:
a substrate,
a first insulator layer and a second insulator layer,
an organic semiconductor layer sequence having an active region, which generates or receives light during operation,
a first electrode and a second electrode, and
an encapsulation for the organic semiconductor layer sequence, wherein
the first electrode is arranged between the organic semiconductor layer sequence and the first insulator layer,
the second electrode is arranged on the organic semiconductor layer sequence, wherein the organic semiconductor layer sequence has a first side and a second side opposite to the first side, and wherein the second side is farther away from the first insulator layer compared to the first side,
the first electrode and the second electrode are arranged at least partly above the second insulator layer, wherein the second electrode is arranged on the second side of the organic semiconductor layer sequence, and wherein the second electrode is not in physical contact with the first insulator layer and is not in physical contact with the second insulator layer,
the first insulator layer planarizes at least a region of a top side of the substrate,
the first insulator layer and the second insulator layer are arranged directly on the top side of the substrate,
a first region of the first electrode is arranged directly on the first insulator layer and a second region of the first electrode is arranged on the second insulator layer,
the first side of the organic semiconductor layer sequence is in direct contact with a side of the first electrode remote from the substrate, and
light is emitted or received during operation through the second electrode.

2. The optoelectronic device according to claim 1, wherein the second electrode is arranged at least partly above the first insulator layer and the second insulator layer.

3. The optoelectronic device according to claim 1, wherein the organic semiconductor layer sequence is arranged above the first insulator layer such that the planarizing effect on the substrate by the first insulator layer is passed on to the organic semiconductor layer sequence.

4. The optoelectronic device according to claim 3, wherein the entirety of the organic semiconductor layer sequence is arranged above the first insulator layer.

5. The optoelectronic device according to claim 1, wherein the second electrode abuts the organic semiconductor layer sequence and the encapsulation.

6. The optoelectronic device according to claim 1, wherein the substrate is transparent.

7. The optoelectronic device according to claim 1, wherein the second insulator layer comprises an inorganic material.

8. The optoelectronic device according to claim 1, wherein the second insulator layer comprises oxide or nitride or both oxide and nitride.

9. The optoelectronic device according to claim 1, wherein the first insulator layer and the second insulator layer comprise different materials.

10. The optoelectronic device according to claim 1, wherein the first insulator layer comprises an organic polymer and the second insulator layer comprises an inorganic material.

11. The optoelectronic device according to claim 1, wherein the substrate is flexible.

12. The optoelectronic device according to claim 1, wherein a metallization is arranged on the first electrode or on the second electrode.

13. The optoelectronic device according to claim 1, wherein the first insulator layer comprises an organic polymer and the second insulator layer comprises an inorganic material.

14. An optoelectronic device comprising:
a substrate,
a first insulator layer and a second insulator layer,
an organic semiconductor layer sequence having an active region, wherein the organic semiconductor layer sequence is configured to generate or receive light during operation,
a first electrode and a second electrode, and
an encapsulation for the organic semiconductor layer sequence, wherein:
the first electrode is arranged between the organic semiconductor layer sequence and the first insulator layer,
the second electrode is arranged on the organic semiconductor layer sequence,
the organic semiconductor layer sequence having a first surface and a second surface opposite to the first surface and the second surface is farther away from the first electrode compared to the first surface,
the first electrode and the second electrode are arranged at least partly above the second insulator layer,
the second electrode is, with respect to surfaces of the organic semiconductor layer sequence, arranged only on the second surface of the organic semiconductor layer sequence, and
the first insulator layer planarizes at least a region of a top surface of the substrate,
the first insulator layer and the second insulator layer are arranged directly on the top surface of the substrate,
a first region of the first electrode is arranged directly on the first insulator layer and a second region of the first electrode is arranged on the second insulator layer,
the first side of the organic semiconductor layer sequence is in direct contact with a side of the first electrode remote from the substrate, and
light is emitted or received during operation through the second electrode.

15. The optoelectronic device according to claim 14, wherein the second electrode or the encapsulation or both the second electrode and the encapsulation are transparent for the light generated or received during operation by the organic semiconductor layer.

16. The optoelectronic device according to claim 1, wherein the second electrode or the encapsulation or both the second electrode and the encapsulation are transparent for the light generated or received during operation in the active region.

17. The optoelectronic device according to claim 14, wherein the first insulator layer comprises an organic polymer and the second insulator layer comprises an inorganic material.

* * * * *